US011853129B1

United States Patent
Hooshmand et al.

(10) Patent No.: US 11,853,129 B1
(45) Date of Patent: Dec. 26, 2023

(54) INTEGRATED SENSOR IN CLUTCH ASSEMBLY FOR DETERMINING ANGLE OF DISPLAY

(71) Applicant: Apple Inc., Cupertino, CA (US)

(72) Inventors: Mehrdad Hooshmand, San Francisco, CA (US); John C. Difonzo, Emerald Hills, CA (US); Chi Xu, Santa Clara, CA (US); Keeley M. Maher, San Francisco, CA (US); Liangyuan Xiang, Sunnyvale, CA (US); James D. Kelly, Scotts Valley, CA (US)

(73) Assignee: Apple Inc., Cupertino, CA (US)

( * ) Notice: Subject to any disclaimer, the term of this patent is extended or adjusted under 35 U.S.C. 154(b) by 1295 days.

(21) Appl. No.: 16/252,193

(22) Filed: Jan. 18, 2019

Related U.S. Application Data

(60) Provisional application No. 62/735,742, filed on Sep. 24, 2018.

(51) Int. Cl.
*G06F 1/16* (2006.01)
*H05K 5/00* (2006.01)

(52) U.S. Cl.
CPC .......... *G06F 1/1681* (2013.01); *G06F 1/1637* (2013.01); *H05K 5/0017* (2013.01)

(58) Field of Classification Search
CPC ........ G01D 5/145; G01D 5/16; G01R 33/093; G01R 33/096; G06F 1/1677; G06F 1/3287; G06F 1/3296; G06F 1/1618; G06F 3/16; Y02D 10/00; Y02D 30/50; G06T 3/60; H04M 1/0214; H04M 1/0216; H04M 1/0245
See application file for complete search history.

(56) References Cited

U.S. PATENT DOCUMENTS

| | | | |
|---|---|---|---|
| 7,684,822 | B2 | 3/2010 | Park et al. |
| 7,933,638 | B2 | 4/2011 | Hakamata et al. |
| 8,572,812 | B2 | 11/2013 | Mizuta et al. |
| 8,624,695 | B2 | 1/2014 | Cretella, Jr. et al. |
| 9,035,646 | B2 | 5/2015 | Hirayama |
| 9,474,345 | B2 | 10/2016 | Smith et al. |
| 9,742,456 | B2 | 8/2017 | Park et al. |
| 9,897,465 | B2 | 2/2018 | Difonzo et al. |
| 9,954,571 | B2 | 4/2018 | Sartee et al. |

(Continued)

*Primary Examiner* — Nelson M Rosario
(74) *Attorney, Agent, or Firm* — BAKERHOSTETLER

(57) ABSTRACT

This application relates to a portable electronic device. The portable electronic device includes a housing including (i) a lower case, and (ii) an upper case pivotally coupled to the lower case with a hinge assembly. The housing includes a processor capable of providing instructions, an operational component in communication with the processor, where the processor is capable of executing a function, and a magnetic detection system included within the hinge assembly. The magnetic detection system includes a magnetic element capable of generating a magnetic field, and a magnetic sensor capable of determining an angle between the lower case and the upper case based on the magnetic field, where when the processor determines that the angle between the lower case and the upper case satisfies a predetermined threshold angle, the processor provides the instructions to the operational component to execute the function.

19 Claims, 11 Drawing Sheets

(56) References Cited

U.S. PATENT DOCUMENTS

| | | | |
|---|---|---|---|
| 2010/0328860 A1* | 12/2010 | Kim | H04M 1/0216 |
| | | | 361/679.01 |
| 2016/0275648 A1* | 9/2016 | Honda | G06F 1/1618 |
| 2017/0082461 A1* | 3/2017 | DiFonzo | G01R 33/096 |
| 2018/0234530 A1 | 8/2018 | Lee et al. | |
| 2019/0025889 A1* | 1/2019 | Szeto | G06F 3/1446 |

* cited by examiner

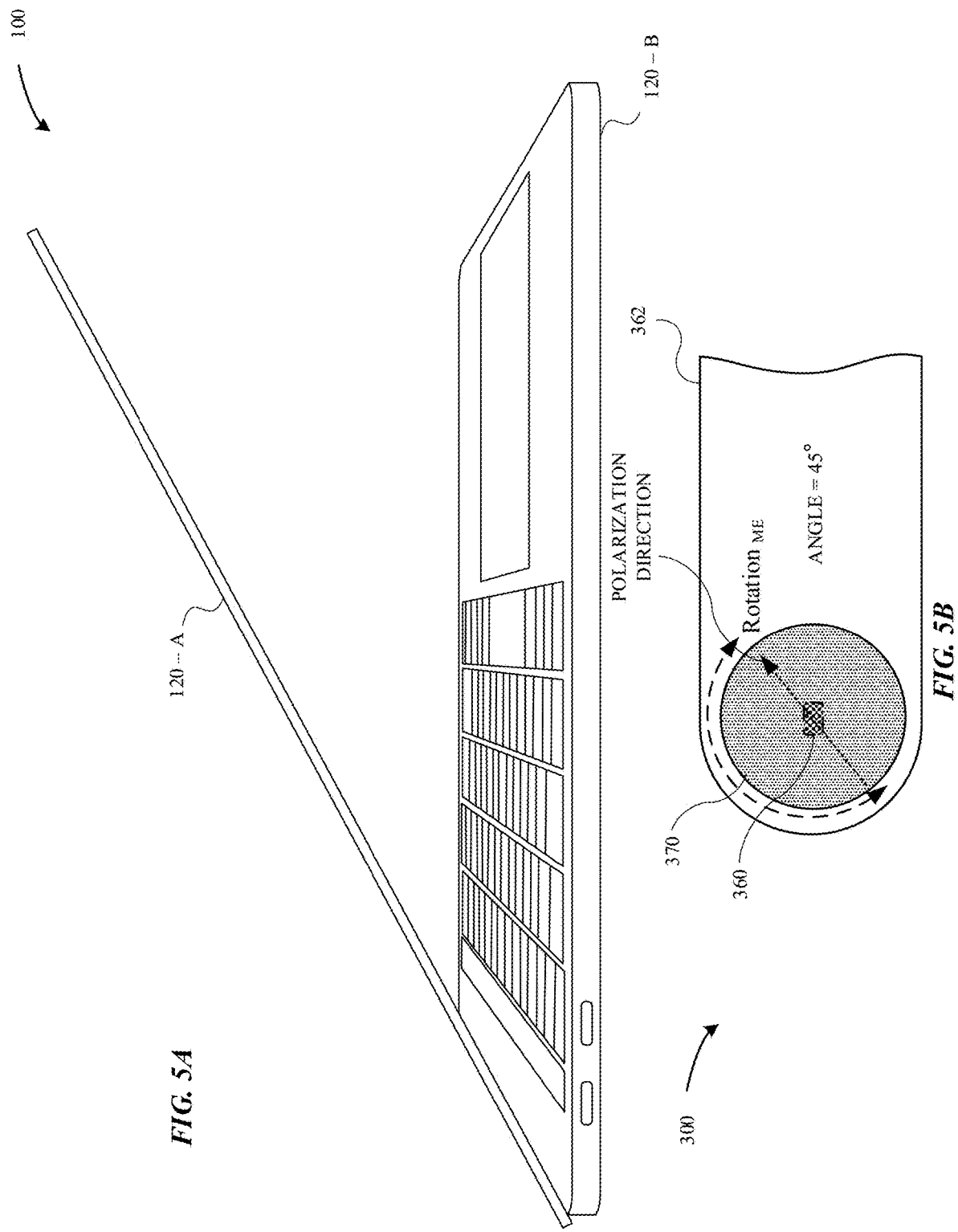

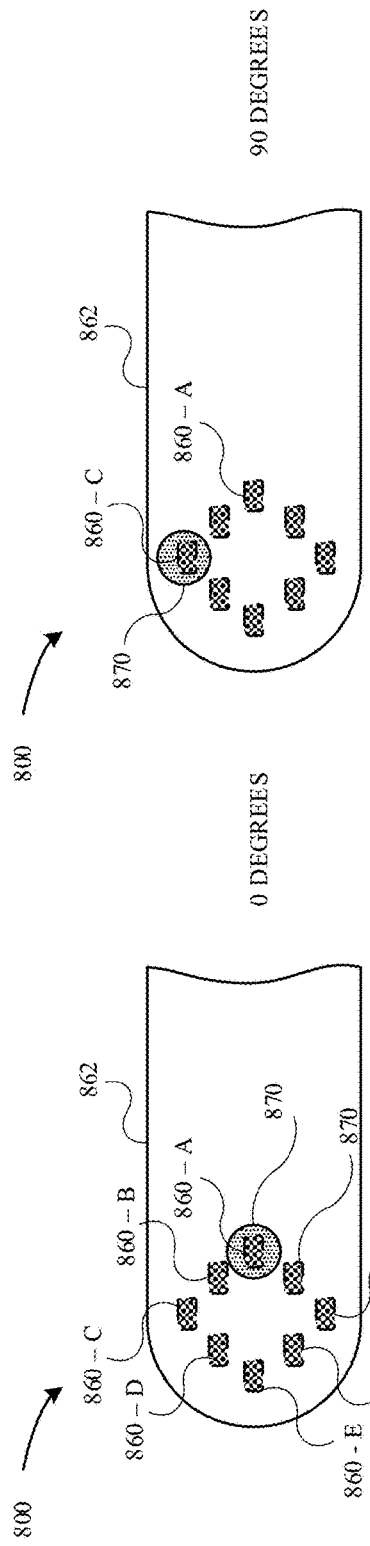
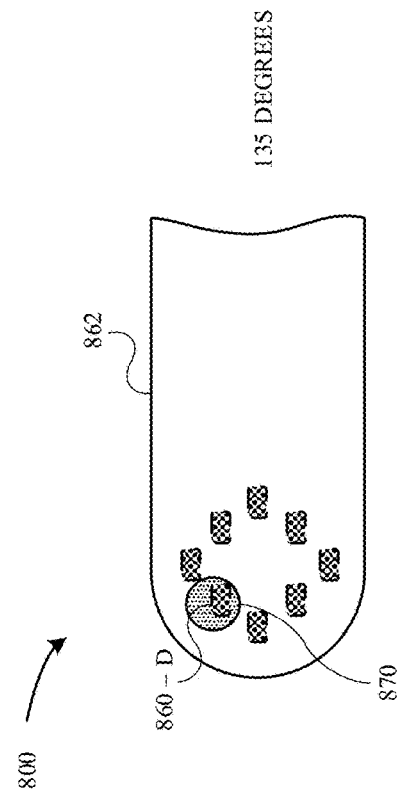
FIG. 8B
FIG. 8C
FIG. 8D

INTEGRATED SENSOR IN CLUTCH ASSEMBLY FOR DETERMINING ANGLE OF DISPLAY

CROSS-REFERENCE TO RELATED APPLICATIONS

The present application claims the benefit of U.S. Provisional Application No. 62/735,742, entitled "INTEGRATED SENSOR IN CLUTCH ASSEMBLY FOR DETERMINING ANGLE OF DISPLAY," filed Sep. 24, 2018, the content of which is incorporated herein by reference in its entirety for all purposes.

FIELD

The described embodiments relate generally to a sensor for determining an angle of a display of a portable electronic device. More particularly, the described embodiments relate to a sensor that is integrated into a clutch assembly of the portable electronic device for determining the angle of the display.

BACKGROUND

A portable electronic device (e.g., a laptop, etc.) may include multiple operational components for performing complex functions. In particular, the operational components of the portable electronic device are capable of performing complex functions such as internet browsing, graphic design, word processing, media streaming, etc. that draw a lot of power from a battery. In order to preserve the battery's power, the portable electronic device is capable of adjusting a power usage scheme based on whether the portable electronic device detects that the portable electronic device is in an open configuration or a closed configuration. However, the detection mechanism occupies a large amount of available space within a cavity of the portable electronic device. Additionally, the detection mechanism utilized by the portable electronic device may be susceptible to external magnetic interference, thereby negatively affecting the accuracy of this detection system.

SUMMARY

This paper describes various embodiments that relate to a sensor for determining an angle of a display of a portable electronic device. In particular, the various embodiments relate to a sensor that is integrated into a clutch assembly of the portable electronic device for determining the angle of the display.

According to some embodiments, a portable electronic device is described. The portable electronic device includes a housing having (i) a first case, and (ii) a second case, where the housing is capable of carrying components that include a processor capable of providing instructions, an operational component in communication with the processor, where the operational component is capable of executing a function, and an angular detection system in communication with the processor. The angular detection system includes a magnetic element capable of generating a magnetic field, where the magnetic field is characterized as having a magnetic field orientation, and a magnetic sensor capable of determining an angle between the first case and the second case based on the magnetic field orientation.

According to some embodiments, a portable electronic device is described. The portable electronic device includes an operational component and a first case that is pivotally coupled to a second case. The portable electronic device includes a processor capable of providing instructions, a magnetic element carried by the first case, where the magnetic element is capable of generating a magnetic field having a magnetic field orientation, and a magnetic angle sensor carried by the second case, where while pivoting the first case relative to the second case, the magnetic angle sensor is capable of (i) determining an angle between the first case and the second case in accordance with the magnetic field orientation, and (ii) providing a corresponding detection signal to the processor when the angle satisfies a predetermined angle threshold such that the processor provides the instructions for executing a function by the operational component.

According to some embodiments, a portable electronic device is described. The portable electronic device includes a first part that is pivotally coupled to a second part with a hinge assembly. The portable electronic device includes a processor capable of providing instructions, an operational component in communication with the processor, the operational component capable of executing a function based on the instructions provided by the processor, and an angular detection system included within the hinge assembly. The angular detection system includes a magnetic element that provides a magnetic field and an angle sensor in communication with the processor, such that (i) when the angle sensor determines that an angle between the first part and the second part satisfies a first angle threshold, the processor provides a first set of instructions such as to cause the operational component to execute a first function, and (ii) when the angle sensor determines that the angle between the first part and the second part satisfies a second angle threshold, the processor provides a second set of instructions such as to cause the operational component to execute a second function different than the first function.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 5A-5B illustrate a side view and a cross-sectional view of a sensor system for determining a display angle, in accordance with some embodiments.

FIGS. 8A-8D illustrate a top view and cross-sectional views of a sensor system for determining a display angle, in accordance with some embodiments.

DETAILED DESCRIPTION

Figure 1:
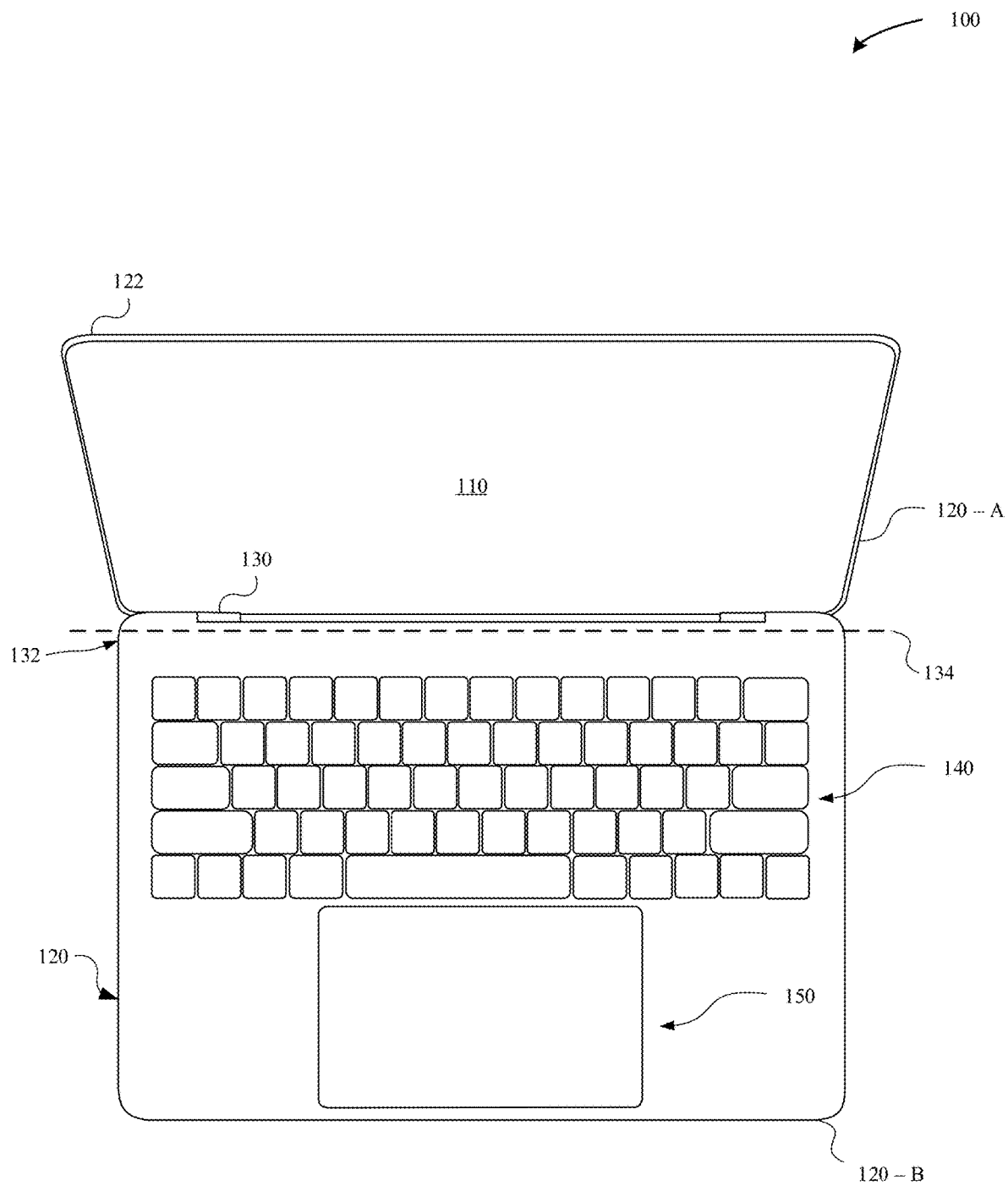
FIG. 1 illustrates a perspective view of a portable electronic device that includes a sensor for determining a display angle, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to a sensor for determining an angle of a display of a portable electronic device. In particular, the various embodiments relate to a sensor that is integrated into a clutch assembly of the portable electronic device for determining the angle of the display. As described herein, the clutch assembly may also be referred to as a hinge assembly.

Although portable electronic devices include multiple operational components for performing complex functions, performing these complex functions (e.g., word processing, media streaming, graphic design, etc.) may consume a large amount of power from a battery. In order to limit usage of the battery's power, these portable electronic devices may adjust a power usage scheme based on whether the portable electronic device is in an open configuration or a closed configuration. However, the detection mechanism utilized by the portable electronic device may consume a large amount of space. Especially as portable electronic devices incorporate additional components, the amount of available space to carry such a detection mechanism becomes significantly limited. Additionally, the detection mechanism utilized by the portable electronic device may be susceptible to external magnetic interference, thereby negatively impacting the accuracy of determine whether the portable electronic device is in the open or closed configuration.

To cure the aforementioned deficiencies, the systems and technique described herein relate to a sensor system that is incorporated into and/or integrated within a clutch assembly of the portable electronic device. In particular, the sensor system includes a magnetic element that may rotate with a lid portion of the portable electronic device, and a magnetic sensor that may rotate with a base portion of the portable electronic device. Furthermore, the magnetic sensor is capable of determining a magnetic orientation and/or absolute angle between the lid and base portions.

According to some embodiments, a portable electronic device is described. The portable electronic device includes a housing having (i) a first case, and (ii) a second case, where the housing is capable of carrying components that include a processor capable of providing instructions, an operational component in communication with the processor, where the operational component is capable of executing a function, and an angular detection system in communication with the processor. The angular detection system includes a magnetic element capable of generating a magnetic field, where the magnetic field is characterized as having a magnetic field orientation, and a magnetic sensor capable of determining an angle between the first case and the second case based on the magnetic field orientation.

These and other embodiments are discussed below with reference to FIGS. 1, 2A-2B, 3A-3B, 4A-4B, 5A-5B, 6A-6B, 7A-7B, 8A-8D, and 9-10; however, those skilled in the art will readily appreciate that the detailed description given herein with respect to these figures is for explanatory purposes only and should not be construed as limiting.

FIG. 1 illustrates a portable electronic device that includes a sensor system for determining a display angle, in accordance with various embodiments. In particular, the sensor system may be capable of determining a display angle between an upper case and a lower case of the portable electronic device. The upper and lower cases may be referred to as first and second cases or proximal and distal cases. According to some embodiments, the sensor system may determine a strength of a magnetic field generated by the magnetic element in order to determine the display angle. In some embodiments, the sensor system may determine an orientation of a magnetic field of the magnetic element in order to determine the display angle. According to some embodiments, the sensor system may be integrated into a clutch assembly or hinge assembly that pivotally and/or rotatably couples the upper case to the lower case. According to some examples, the portable electronic device can include a computing device, a smartphone, a tablet, a laptop, a smartwatch, a fitness tracker, a mobile phone, a wearable consumer device, and the like. The enclosure of the portable electronic device can also be referred to as a housing. According to some embodiments, the portable electronic device 100 carries one or more operational components within a cavity, that may include a circuit board, an antenna, a multi-core processor, a haptic feedback module, a camera, a sensor, an IR detector, an inductive charging coil, and the like.

According to some examples, the techniques described herein may also apply to a case for a portable electronic device, such as a folio, a cover, a foldable cover, a sleeve, a smart cover, a smart keyboard, and the like. In particular, any one of the embodiments of the sensor systems as described herein can be utilized to determine a display angle for a hinged accessory (e.g., foldable cover, etc.) for the portable electronic device. For example, the sensor systems described herein are capable of determine whether the hinged accessory is in an open configuration or a closed configuration, and subsequently provide corresponding detection signal(s) to a processor. The processor is capable of executing different functions based on whether the hinged accessory is in the open or closed configuration.

FIG. 1 illustrates a front facing perspective view of a portable electronic device 100, in accordance with some embodiments. The portable electronic device 100 includes a base portion 120-B (also referred to as a lower case, a base, and the like), which is pivotally and/or rotatably coupled to a lid portion 120-A (also referred to as a display lid, an upper case, and the like). The base portion 120-B and the lid portion 120-A may refer to different sections of an enclosure 120 of the portable electronic device 100. In some embodiments, the lid portion 120-A pivots and/or rotates with respect to the base portion 120-B with respect to a hinge 132. In particular, the hinge 132 may include a clutch assembly 130 capable of pivoting the lid portion 120-A with respect to the base portion 120-B. The lid portion 120-A may pivot with respect to the base portion 120-B between a closed position and an open position by using the hinge 132. According to some examples, the closed position may correspond to an angle between an internal surface of the lid portion 120-A and an internal surface of the base portion 120-B that is less than 1°. In some examples, the closed position may correspond to an angle between the internal surface of the lid portion 120-A and the internal surface of the base portion 120-B that is 0°. According to some examples, the open position may correspond to an angle between the internal surface of the lid portion 120-A and the internal surface of the base portion 120-B that is greater than 0° or greater than 1°. It should be noted that the open and closed positions may correspond to any predetermined angle. As will be described in greater detail herein, the portable electronic device 100 is capable of performing exclusive functions based on the angle between the lid portion 120-A and the base portion 120-B.

In some embodiments, the clutch assembly 130 may include a mechanism for holding the angle (or the display angle) in a static position. The clutch assembly 130 may include a common axis 134 between the lid portion 120-A and the base portion 120-B. The clutch assembly 130 may include friction elements (not illustrated) that define a friction hinge between the lid portion 120-A and the base portion 120-B. As the lid portion 120-A is pivoted relative to the base portion 120-B, both of the lid and base portions 120-A, B generate torque at the axis 134 to generate pivotal motion, while the friction elements impart a predetermined amount of resistance to this pivotal motion such as to arrest the pivoting motion between the lid and base portions 120-A, B in a selected position.

According to some embodiments, the lid portion 120-A may include a display 110 that is backed by a rear cover 122. It should be noted that in some embodiments, the lid portion 120-A does not include any magnetic elements. In particular, the cavity of the lid portion 120-A may be unable to carry magnetic elements due to a lack of available space within the cavity. For example, the cavity of the lid portion 120-A may carry operational components (e.g., camera, etc.) that prevents inclusion of these magnetic elements due to lack of available space. Beneficially, the absence of magnetic elements in the lid portion 120-A may also reduce the amount of stray magnetic fields that would otherwise interfere with the sensing accuracy of the magnetic sensor, as will be described in greater detail herein.

The base portion 120-B may include one or more input devices, such as a keyboard 140 or a touchpad 150, either of which is capable of receiving input from a user. The base portion 120-B and the lid portion 120-A may each be formed from an enclosure that defines a cavity capable of carrying components. In some embodiments, cables (e.g., flex cables, etc.) may electrically couple the components of the lid and base portions 120-A, B.

According to some examples, the lid portion 120-A and/or the base portion 120-B may have a unibody construction (i.e., formed from a single piece of metal). According to some examples, the enclosure 120 may be formed of a combination of at least one of metal (e.g., aluminum, anodized aluminum, titanium, stainless steel, etc.), polymers (e.g., plastic, etc.), graphite fibers, glass, RF-transparent materials, and the like.

Figures 2A, 2B:
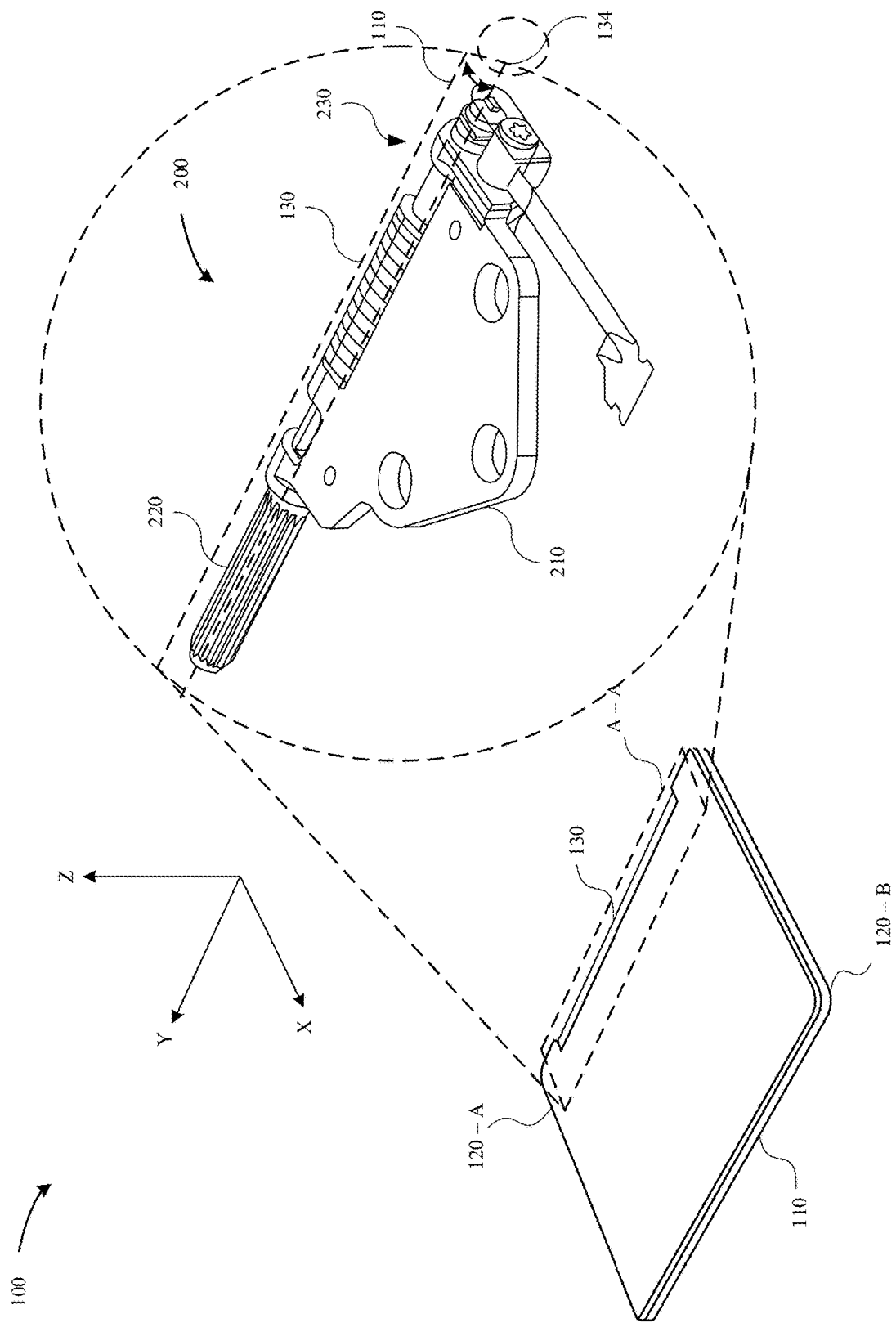
FIGS. 2A-2B illustrate perspective views of a sensor system for determining a display angle, in accordance with some embodiments.

FIGS. 2A-2B illustrate a perspective view of the portable electronic device and a sensor system, respectively, in accordance with some embodiments. FIG. 2A illustrates the portable electronic device 100 in a closed configuration, which may correspond to an angle between the internal surface of the lid portion 120-A and the internal surface of the base portion 120-B that is less than 1°. According to some examples, when the portable electronic device 100 is in the closed configuration, the portable electronic device 100 may execute a sleep function, which corresponds to entering a low-power mode where the portable electronic device 100 is held in RAM and the portable electronic device 100 cuts power to unneeded subsystems and places the RAM into a minimum power state. In some examples, the portable electronic device 100 may only execute the sleep function when the portable electronic device 100 is in the closed configuration. According to some examples, when the portable electronic device 100 is in the closed configuration, the portable electronic device 100 may execute a hibernate function where the portable electronic device 100 turns power off to all subsystems and turns off an ambient light for the keyboard 140.

FIG. 2B illustrates a perspective view of a sensor system 200 taken along the reference section A-A of the portable electronic device 100 as illustrated in FIG. 2A, in accordance with some embodiments. In particular, the sensor system 200 includes a portion of a clutch assembly—e.g., the clutch assembly 130. The clutch assembly 130 includes a clutch shaft 220 and a clutch mount 210. The clutch mount 210 may be secured/fixed to the lid portion 120-A, such as a cage or enclosure of the lid portion 120-A. In this manner, the clutch mount 210 (and the lid portion 120-A) are capable of pivoting relative to the base portion 120-B. The clutch shaft 220 is capable of pivoting relative to the axis 134. In some examples, the clutch shaft 220 is coupled to the base portion 120-B. In some examples, the lid portion 120-A is capable of pivoting relative to the base portion 120-B at an angle between about 1° to about 135°. In other examples, the lid portion 120-A is capable of pivoting relative to the base portion 120-B at an angle between about 0° to about 180°.

According to some embodiments, the sensor system 200 includes a sensing assembly 230 that includes at least one magnetic element(s) and at least one sensor for detecting at least one of a strength of a magnetic field generated by the magnetic element(s) or an orientation of the magnetic field of the magnetic element(s) as based on the polarization direction, as will be described in greater detail herein.

In particular, the sensor system 200 is integrated within the clutch assembly 130 such as to minimize/prevent stray magnetic fields by external magnetic objects. In particular, if the sensor system 200 were arranged along the peripheral edges of the enclosure 120 of the portable electronic device 100 (e.g., along the edges of the keyboard 140), then the magnetic element(s) of the sensor system 200 are much more susceptible to stray magnetic fields. Instead by incorporating the sensor system 200 within the clutch assembly 130, the sensor system 200 is more immune to external magnetic fields. Moreover, by integrating the sensor system 200 within the clutch assembly 130, a significant amount of space is saved (e.g., in the y-direction). The amount of space saved enables for additional operational components (e.g., cables, camera system, etc.) to be incorporated along peripheral edges of the lid and base portions 120-A, B. Furthermore, incorporating the sensor system 200 within the clutch assembly allows for more tolerance in the x-direction, such as if the portable electronic device 100 is subject to a load event (e.g., dropped on the floor, etc.).

According to some embodiments, the sensor system 200 is capable of executing functions related to thermal management, thermal cooling, and/or acoustic noise control based on the angle between the internal surface of the lid portion 120-A and the internal surface of the base portion 120-B. In some embodiments, the portable electronic device 100 includes a cooling unit that is capable of cooling operational components (e.g., battery, main logic board, etc.) of the portable electronic device. In some embodiments, the cooling unit includes a fan and a controller that is capable of controlling the speed (e.g., RPM) of the fan. In some embodiments, the controller may be electronically coupled to a processor (e.g., main logic board, etc.), where the controller is in electronic communication with the sensor system 200. The processor and/or controller is capable of controlling thermal cooling of the portable electronic device 100 based on the angle between the lid portion 120-A and the base portion 120-B. For example, based on the angle as detected by the sensor system 200, the processor may determine that the portable electronic device 100 is in an open configuration and that processor—intensive subsystems are likely generating a large amount of thermal energy. As a result, the processor and/or controller is capable of adjusting the speed of the fan in order to promote greater cooling of the portable electronic device 100. In another example, based on the angle, the processor and/or controller may determine that the portable electronic device 100 is in the closed configuration and that the processor—intensive subsystems are not likely generating a large amount of thermal energy. Accordingly, in order to reduce acoustic noise, the processor and/or controller may determine that running the fan at a high speed is unnecessary, and the speed of the fan may be reduced in order to reduce the amount of the acoustic noise generated by the cooling unit.

Figure 3A:
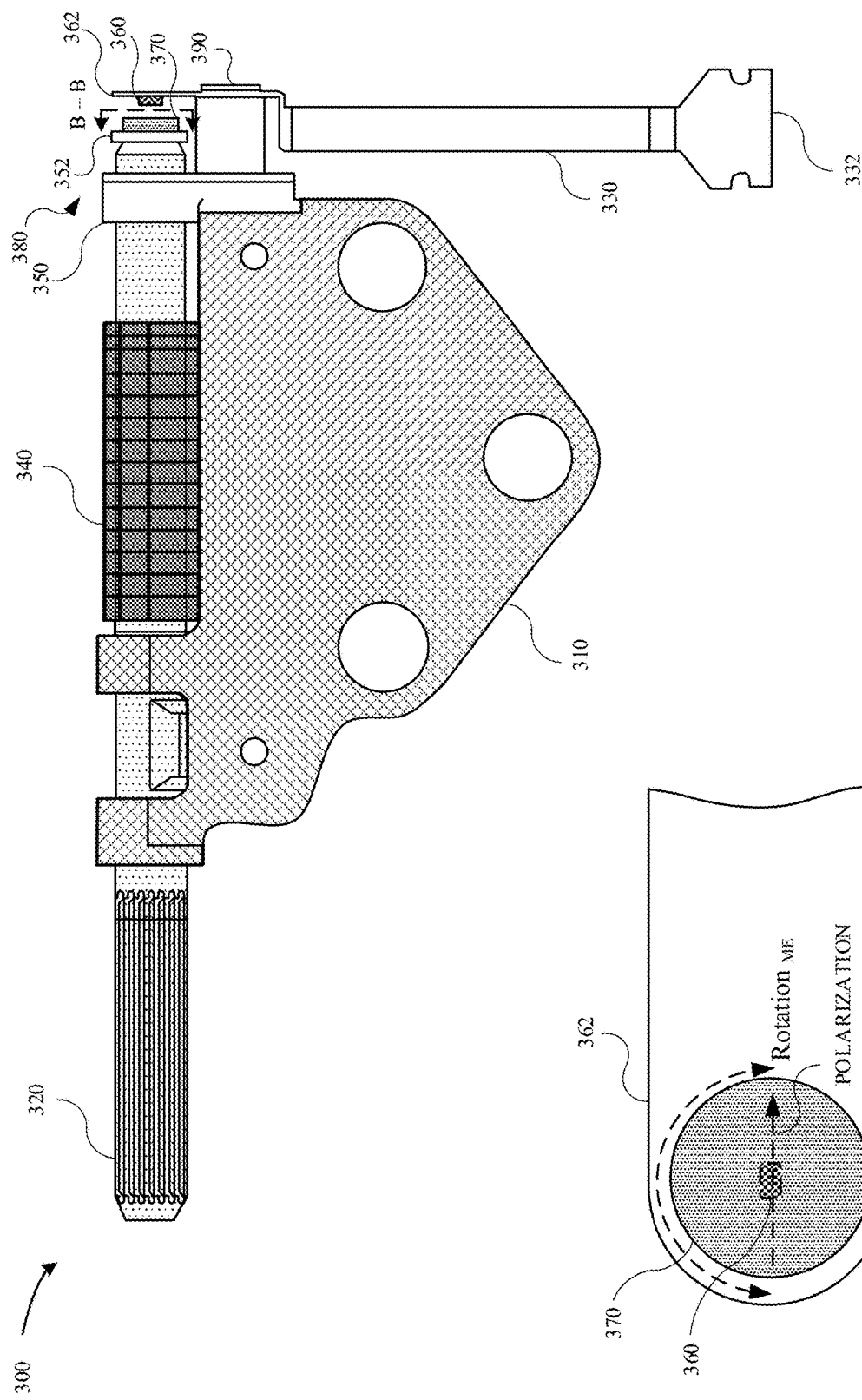
FIGS. 3A-3B illustrate a top view and a cross-sectional view of a sensor system for determining a display angle, in accordance with some embodiments.
Figure 3B:
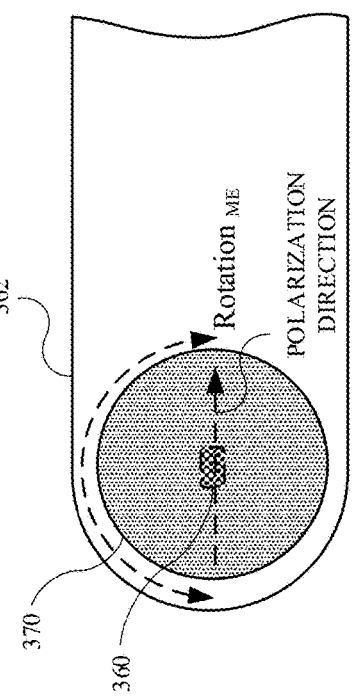

FIGS. 3A-3B illustrate a top view and a cross-sectional view of a sensor system 300, in accordance with some embodiments. In some embodiments, the sensor system 300 may correspond to the sensor system 200. As illustrated in FIG. 3A, the sensor system 300 includes a clutch mount 310 that is coupled to a cage/enclosure of the lid portion 120-A. Accordingly, the clutch mount 310 pivots with the lid portion 120-A. The clutch mount 310 further includes a bushing 350 with a boss. In some examples, the bushing 350 holds the clutch shaft 320. The bushing 350 is a sleeve or tube that defines a bearing surface and allows for relative sliding motion of the clutch shaft 320 when the lid and base portions 120-A, B are pivoted. The sensor system 300 includes a clutch shaft 320 that freely pivots about the axis 134. The clutch shaft 320 is coupled to a cage/enclosure of the base portion 120-B.

The sensor system 300 includes friction elements 340 that define a friction hinge between the lid portion 120-A and the base portion 120-B. As the lid portion 120-A is pivoted relative to the base portion 120-B, both of the lid and base portions 120-A, B generate torque at the axis 134 to generate pivotal motion to open/close the portable electronic device 100. The friction elements 340 offer a predetermined amount of resistance to this pivoting motion such as to arrest the pivoting motion between the lid and base portions 120-A, B in a selected position.

Additionally, the sensor system 300 includes a sensing assembly 380 that includes at least a magnetic element 370 and a sensor 360. The magnetic element 370 is secured to a shunt 352 that is disposed at a distal end of the clutch shaft 320. The magnetic element 370 and the shunt 352 may be adhered to the clutch shaft 320 using a bonding agent. Accordingly, as the clutch shaft 320 pivots along the axis 134 in a direction, the magnetic element 370 also pivots along the axis 134 according to the same direction. According to some embodiments, the magnetic element 370 is capable of generating a magnetic field. According to some embodiments, the shunt 352 is capable of adjusting the magnetic flux generated by the magnetic element 370. The assembly of the magnetic element 370 to the clutch shaft 320 is performed by inserting the magnetic element 370 into a polarized fixture, such that the pole is set relative to the sensor 360 (e.g., the TMR sensor). In other embodiments, the bushing 350 and the clutch mount 310 are a single part.

In some embodiments, the sensor 360 is coupled to a mounting element 362 of the base portion 120-B. In some embodiments, the sensor 360 is fixed to the base portion 120-B such that the sensor 360 does not pivot along with the lid portion 120-A. In other words, the sensor 360 is stationary and fixed to the base portion 120-B. The sensor 360 may be coupled to a mounting element 362, where the mounting element 362 is coupled to the clutch mount 310 with a screw 390. In some examples, the sensor 360 is a magnetic sensor that is capable of determining a magnetic orientation associated with the magnetic element 370 and/or a strength of a magnetic field generated by the magnetic element 370.

In some embodiments, the sensing assembly 380 may be electrically coupled to a flexible cable 330, where the flexible cable 330 includes a connector 332 (e.g., board-to-board connector, coaxial connector, etc.) The flexible cable 330 may transmit electrical signals from the sensor 360 to a processor/main logic board, as described in greater detail with reference to FIG. The flexible cable 330 may be mounted to the bushing 350 and fixed with a screw that fastens to the boss on the bushing 350. The flexible cable 330 may be coupled to the clutch shaft 320 using a fixture that caps over the sensing assembly 380, setting the position of the flexible cable 330 before it is fastened with the screw. In some embodiments, the sensing assembly 380 may be mounted to a fixed printed circuit board (PCB).

In some examples, the sensor 360 is a magnetic position sensor, such as a magnetic position sensor manufactured by "Monolithic Power Systems" (MPS) capable of directly determining the absolute angular position of the magnetic element 370 relative to the sensor 360, and producing a digital signal of the absolute angular position. In some examples, the MPS sensor is capable of determining a magnetic orientation of a magnetic field of the magnetic element 370 that may be based on the polarization direction of the magnetic element 370. In particular, the polarization direction of the magnetic element 370 changes in accordance with the rotation of the clutch shaft 320. Thus, the MPS sensor is capable of determining the magnetic orientation based on the polarization direction relative to the MPS sensor. In some examples, the MPS sensor is capable of determining the absolute display angle between the lid and base portions 120-A, B, and transmitting a digital signal of the absolute display angle to the main logic board. Beneficially, the MPS sensor reduces latency in determining the absolute display angle relative to other types of magnetic sensors.

In some examples, the sensor 360 is a tunnel-magnetoresistance (TMR) sensor. The TMR sensor is capable of detecting the angle of the magnetic field through changing current in a barrier layer of the TMR sensor. The resistance is then relayed to the main logic board by the TMR sensor. The TMR sensor is capable of determining a magnetic orientation of the magnetic field of the magnetic element 370, and providing a corresponding sine/cosine of the angle of the lid portion 120-A relative to the base portion 120-B. Thereafter, the processor at the main logic board is capable of determining the absolute display angle based on the sine/cosine of the display angle. In some examples, the TMR sensor is capable of determining the absolute display angle to +/−5° accuracy.

Beneficially, the MPS sensor and the TMR sensor of the sensor system 300 are more immune to stray magnetic fields relative to other types of magnetic sensors (e.g., Hall effect sensors, etc.). Firstly, the aforementioned angle sensors may be positioned very close to the magnetic element 370. As a result, the magnetic sensor is inside a very strong magnetic field generated by the magnetic element 370, which an external magnetic field is not able to easily alter. Secondly, the magnetic sensors are fundamentally measurement devices rather than switches. As a result, a change to the output of these magnetic sensors causes a marginal change in the reading of the angle, which is generally inconsequential.

According to some embodiments, the sensor 360 may be calibrated during an in-line process during final assembly of the sensing assembly 380. The lid portion 120-A is closed relative to the base portion 120-B, at which point the sensor 360 is zero'd (i.e., the resistance is baselined). Thereafter, as part of the calibration process, the lid portion 120-A may be opened to 90°, and the corresponding resistance value is used to create an interpolation of the display angle through 0°-135° swings.

FIG. 3B illustrates a cross-sectional view of the sensing assembly 380, in accordance with some embodiments. As illustrated in FIG. 3B, the sensor 360 is disposed concentric to the magnetic element 370 such that the orientation of the magnetic field generated by the magnetic element 370 may be captured by the sensor 360. During the rotation of the magnetic element 370, the position of the magnetic element 370 relative to the clutch shaft 320 remains fixed regardless of the rotation between the lid and base portions 120-A, B. In some embodiments, if the sensor 360 is an MPS sensor and disposed along the circumference of the clutch shaft 220, the MPS sensor may be capable of determining the absolute display angle.

The magnetic element 370 may be polarized through a diameter of the magnetic element 370. In particular, the magnetic element 370 may have magnetic field lines oriented through the diameter of the magnetic element 370. Beneficially, as the clutch shaft 320 rotates along axis 134, the orientation of the magnetic field lines relative to the sensor 360 also changes. In contrast, if the magnetic element 370 is polarized through the axis of the magnetic element 370, then regardless of the rotation of the clutch shaft 320, the orientation of the magnetic field lines will not change because the magnetic field lines and the sensor 360 will always be diametrically opposed to each other.

In some embodiments, the magnetic element 370 is characterized as having a generally circular shape. Beneficially, the circular shape imparts the magnetic element 370 with a generally uniform magnetic field such that the magnetic field is generally uniform regardless of the rotation of the magnetic element 370. In some examples, the magnetic element 370 has a diameter of about 2 mm and a thickness of about 2 mm. In some examples, the magnetic element 370 has a diameter between about 1 mm to about 3 mm and a thickness between about 1 mm to about 3 mm.

Figure 4A:
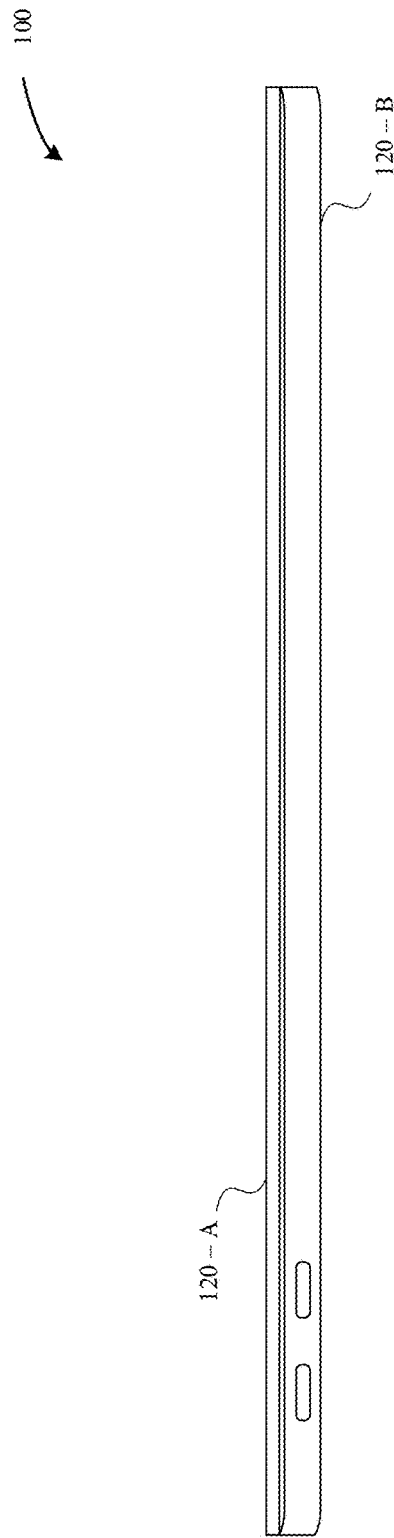
FIGS. 4A-4B illustrate a side view and a cross-sectional view of a sensor system for determining a display angle, in accordance with some embodiments.
Figure 4B:
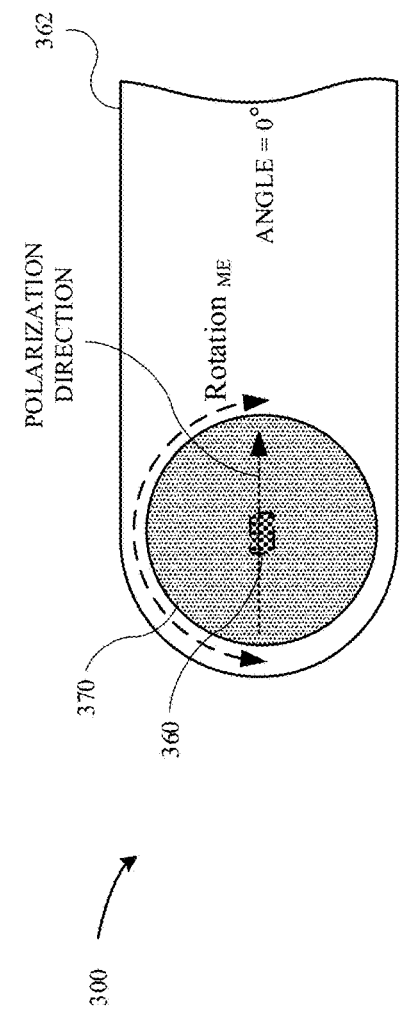

FIGS. 4A-4B illustrate a top view of a portable electronic device and a cross-sectional view of a sensor system of the portable electronic device, in accordance with some embodiments. In some examples, the portable electronic device may correspond to the portable electronic device 100 and the sensor system may correspond to the sensor system 200. As illustrated in FIG. 4A, the portable electronic device 100 is in the closed configuration.

In some examples, the sensor system 200 includes the sensor 360—e.g., a MPS sensor—that is capable of determining an absolute angle between the internal surface of the lid portion 120-A and the internal surface of the base portion 120-B. As illustrated in FIG. 4B, the sensor 360 determines that the absolute display angle is 0° and provides a corresponding signal to the processor. In response to receiving the corresponding signal that indicates that the absolute display angle is 0°, the processor determines that the portable electronic device 100 is in the closed configuration. Accordingly, the processor may execute instructions for a sleep state or a hibernation state that may be exclusive to the closed configuration, as described herein.

In some examples, the sensor 360 of the sensor system 200 is a TMR sensor capable of determining a sine/cosine of the absolute display angle based on a magnetic orientation of the magnetic element 370 relative to the sensor 360, and providing a corresponding signal to the processor. For example, the TMR sensor detects the sine/cosine of the angle through the changing current in a barrier layer of the TMR sensor, and the resulting resistance is relayed to a processor of the main logic board. Thereafter, the processor determines the absolute display angle from the sine/cosine of the absolute display angle to determine whether the portable electronic device 100 is in the closed configuration or the open configuration.

FIGS. 5A-5B illustrate a top view of the portable electronic device 100 and the sensor system 200, in accordance with some embodiments. As illustrated in FIG. 5A, the portable electronic device 100 is in the open configuration, which may correspond to absolute display angle between an internal surface of the lid portion 120-A and an internal surface of the base portion 120-B that is greater than 1°. Thereafter, the processor determines that the portable electronic device 100 is in the open configuration and executes instructions to trigger a wake state from the sleep/hibernation states where subsystems of the portable electronic device 100 are turned on (e.g., RAM, antenna, wireless transceiver, etc.).

In some examples, the open configuration may include (i) a first open state where the display angle is between about 1° to about 90°, and (ii) a second open state where the display angle is between about 90° to about 135°. It should be noted that the first open state and the second open state may correspond to any sets of absolute display angle ranges. In accordance with whether the absolute display angle is categorized in the first open state or the second open state, the processor is capable of executing different sets of functions.

Figure 6A:
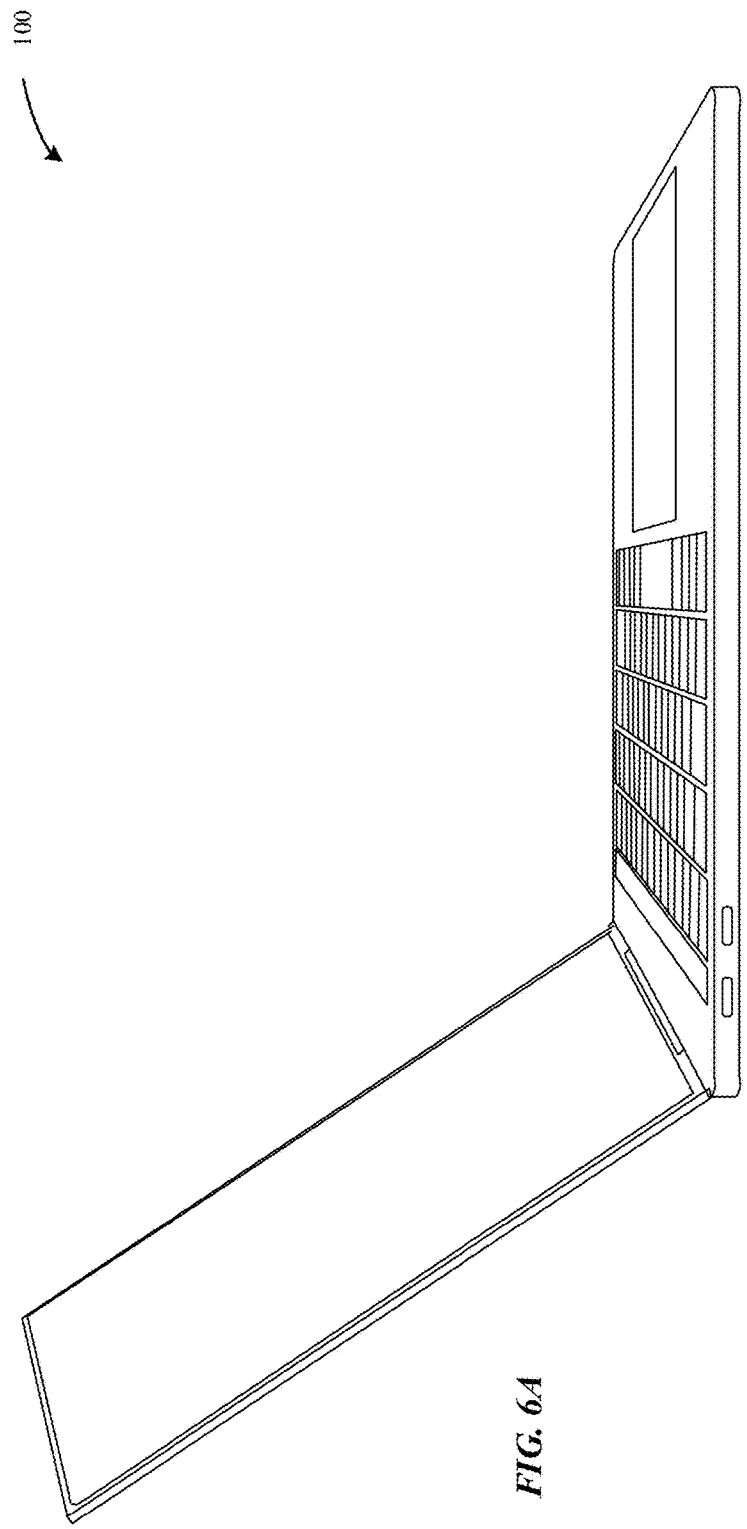
FIGS. 6A-6B illustrate a side view and a cross-sectional view of a sensor system for determining a display angle, in accordance with some embodiments.
Figure 6B:
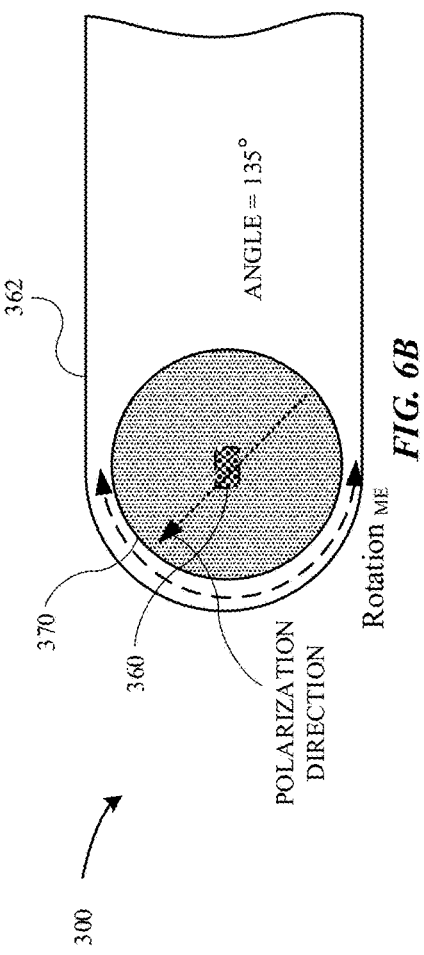

FIGS. 6A-6B illustrate a top view of the portable electronic device 100 and the sensor system 200, in accordance with some embodiments. In contrast to the portable electronic device 100 that is in the first open state as illustrated in FIGS. 5A-5B, the portable electronic device 100 illustrated in FIGS. 6A-6B is in the second open state where the absolute display angle is between e.g., about 90° to about 135°. When the processor determines that the absolute display angle of the portable electronic device 100 is between about 90° to about 135°, the processor may execute functions consistent with the second open state, such as increase CPU processing speed, enabling a dedicated graphics chip to execute instructions, increasing the display 110, and the like.

Figures 7A, 7B:
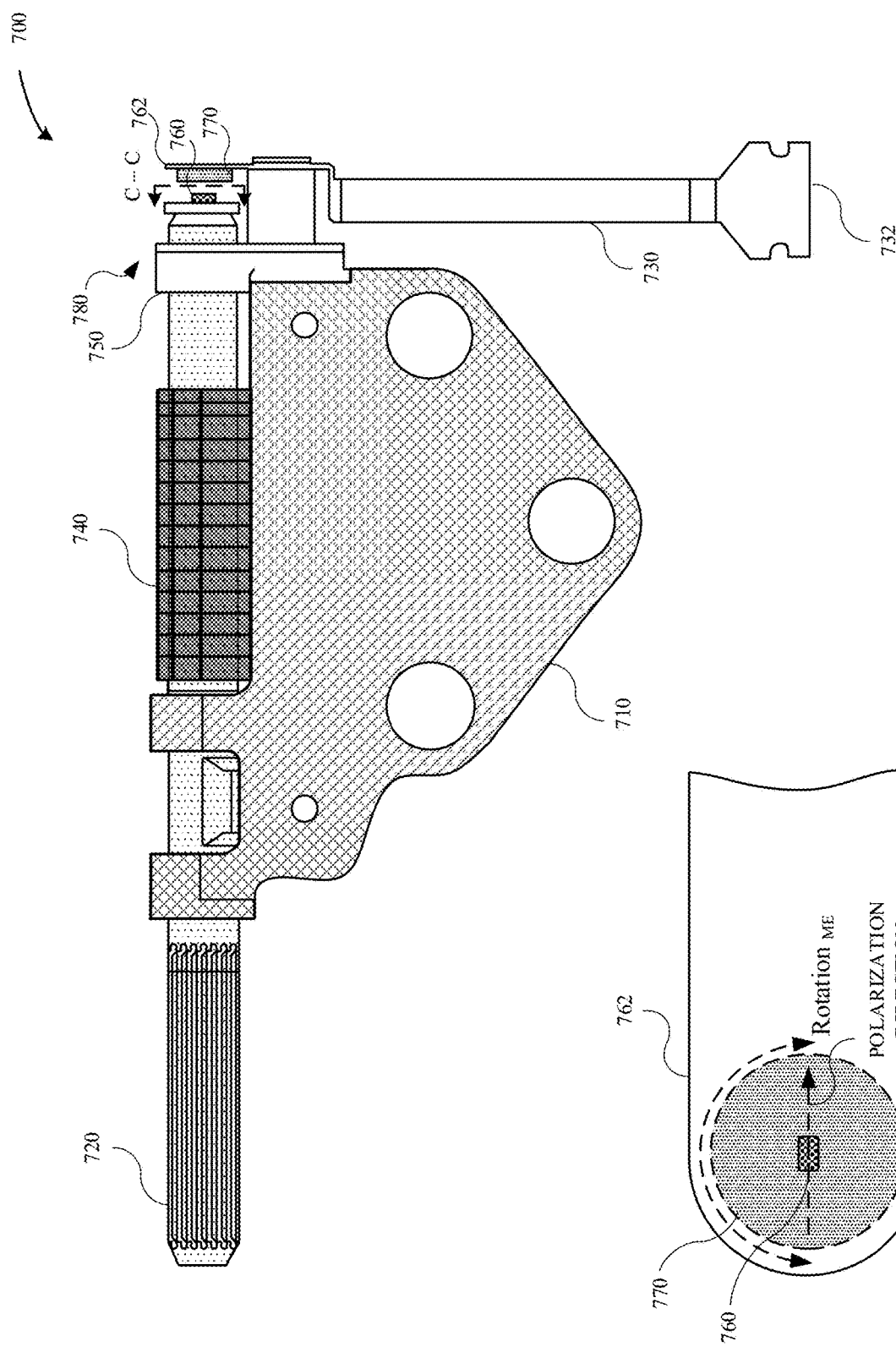
FIGS. 7A-7B illustrate a top view and a cross-sectional view of a sensor system for determining a display angle, in accordance with some embodiments.

FIGS. 7A-7B illustrate a top view and a cross-sectional view of a sensor system 700, in accordance with some embodiments. In some embodiments, the sensor system 700 may be included in the portable electronic device 100. As illustrated in FIG. 7A, the sensor system 700 includes a clutch mount 710 that is coupled to a cage/enclosure of the lid portion 120-A. Accordingly, the clutch mount 710 pivots with the lid portion 120-A. The clutch mount 310 further includes a bushing 750 with a boss. The sensor system includes a clutch shaft 720 that freely pivots about the axis 134.

The sensor system 700 includes friction elements 740 that define a friction hinge between the lid portion 120-A and the base portion 120-B. As the lid portion 120-A is pivoted relative to the base portion 120-B along the axis 134, both of the lid and base portions 120-A, B generate torque at the axis 134 to generate pivotal motion to open/close the portable electronic device 100. The friction elements 740 offer a predetermined amount of resistance to this pivoting motion such as to arrest the pivoting motion between the lid and base portions 120-A, B in a selected position.

Additionally, the sensor system 700 includes a sensing assembly 780 that includes at least one magnetic element 770 and a sensor 760. In contrast to the sensor system 300, the magnetic element 770 of the sensor system 700 is coupled to the base portion 120-B. The magnetic element 770 may be coupled to a mounting element 762 of the base portion 120-B. According to some examples, the sensor 760 is an MPS sensor, a Hall effect sensor or a TMR sensor.

The sensor 760 is secured to a distal end of the clutch shaft 720. The sensor 760 is adhered to the clutch shaft 720 using a bonding agent such as pressure-sensitive adhesive or glue. Accordingly, the sensor 760 pivots with the lid portion 120-A. In some examples, the sensor 760 is a magnetic sensor that is capable of determining an absolute display angle between the lid portion 120-A and the base portion 120-B, as described in detail herein. The sensing assembly 780 is electrically coupled to a flexible cable 730 or a PCB that includes a connector 732 (e.g., board-to-board connector, coaxial connector, etc.) The flexible cable 730 may provide electrical signals from the sensor 760 to a processor/main logic board (not illustrated). In some embodiments, the clutch shaft 720 does not include a magnetic shunt or any other magnetic element that might interfere with the magnetic field detected by the sensor 760.

Figure 8A:
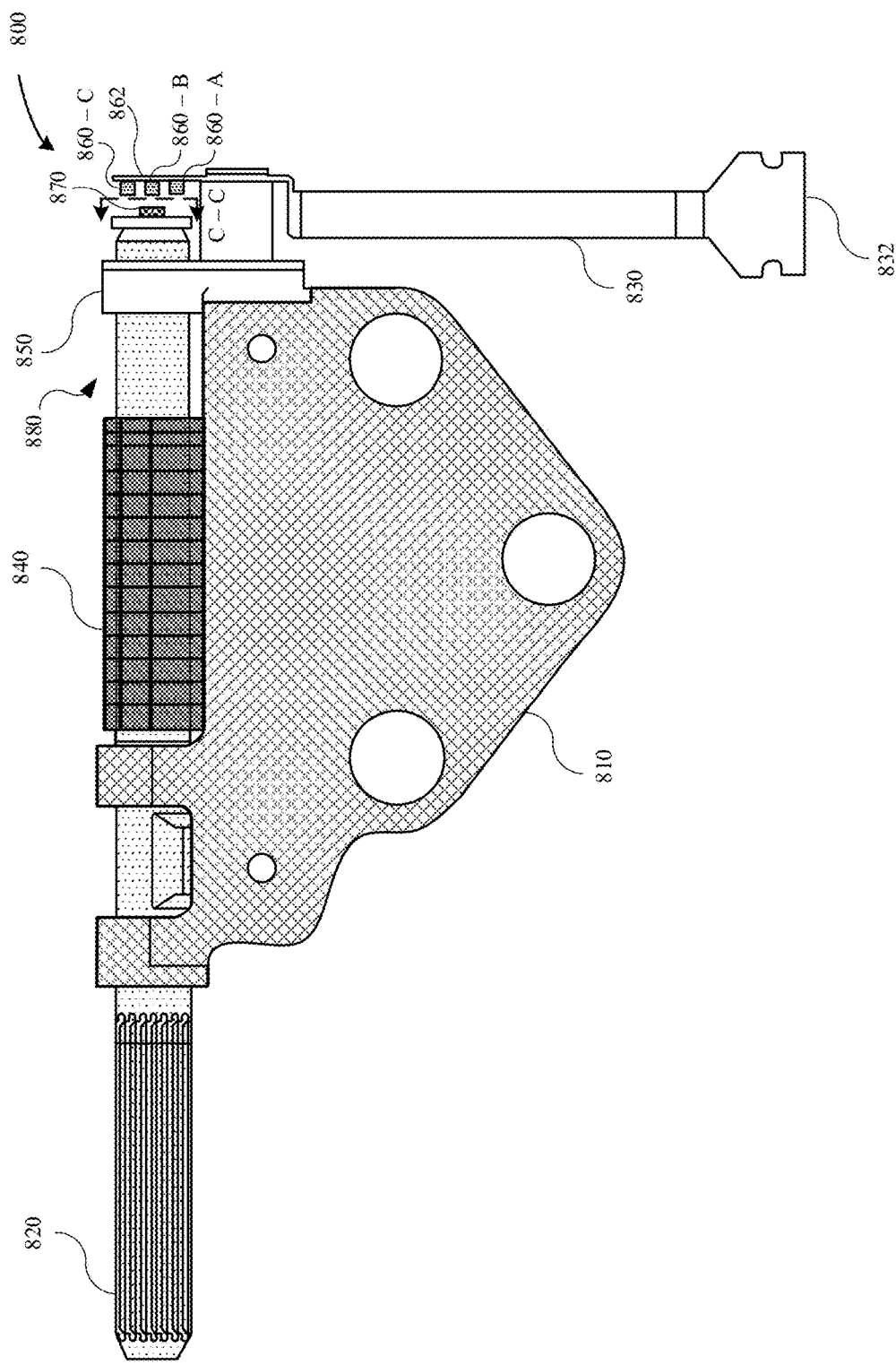

FIGS. 8A-8D illustrate a top view and cross-sectional views of a sensor system 800, in accordance with some embodiments. In some embodiments, the sensor system 800 may be included in the portable electronic device 100. As illustrated in FIG. 8A, the sensor system 800 includes a clutch mount 810 that is coupled to a cage/enclosure of the lid portion 120-A. Accordingly, the clutch mount 810 pivots with the lid portion 120-A. The clutch mount 810 further includes a bushing 850 with a boss. The sensor system 800 includes a clutch shaft 820 that freely pivots about the axis 134.

The sensor system 800 includes friction elements 840 that define a friction hinge between the lid portion 120-A and the base portion 120-B. As the lid portion 120-A is pivoted relative to the base portion 120-B, both of the lid and base portions 120-A, B generate torque at the axis 134 to generate pivotal motion to open/close the portable electronic device 100. The friction elements 840 offer a predetermined amount of resistance to this pivoting motion such as to arrest the pivoting motion between the lid and base portions 120-A, B in a selected position.

Additionally, the sensor system 800 includes at least a magnetic element 870 and an array of Hall effect sensors 860-A, B, C, D, E, F, G. The magnetic element 870 is coupled to the bushing 850 with the boss. The Hall effect sensor is capable of detecting static (i.e., non-changing) magnetic fields, and in response, providing a corresponding detection signal (e.g., binary signal) such as when the detected magnetic field satisfies a magnetic field threshold. The Hall effect sensor is capable of emitting an output voltage that is proportional to the strength of the magnetic field. However, unlike the TMR sensor and MPS sensor, the Hall effect sensor is not capable of determining a magnetic field orientation and/or absolute display angle. Moreover, the Hall effect sensor may be more likely to be false-triggered by the strength of a nearby magnetic field in proximity to the Hall effect sensor to generate a detection signal. In contrast to the MPS and TMR sensors, the Hall effect sensor is much more sensitive to stray magnetic fields. This may be due in part that the Hall effect sensor must be very sensitive in order to detect a magnetic field generated by a very small magnetic element.

As illustrated in FIG. 8B, the Hall effect sensors 860-A, B, C, D, E, F, G are arranged in a circular array or a semi-circular array such that the sensor system 800 is capable of determining an absolute display angle based on which of the Hall effect sensors 860-A, B, C, D, E, F, G is triggered by the magnetic field of the magnetic element 870. In particular, each of the Hall effect sensors 860-A, B, C, D, E, F, G is small (i.e., no larger in size than the magnetic element 870). As the Hall effect sensors 860-A, B, C, D, E, F, G are sensitive to stray magnetic fields, the magnetic element 870 is similar in size to each of the Hall effect sensors 860-A, B, C, D, E, F, G provide increased accuracy in determining the absolute display angle. In other words, the circular array of Hall effect sensors 860-A, B, C, D, E, F, G ensures that only one of the Hall effect sensors 860-A, B, C, D, E, F, G is triggered by the magnetic field of the magnetic element 870. Thereafter, the Hall effect sensor 860-A, B, C, D, E, F, G that is in closest proximity to the magnetic element 870, and therefore, triggered, provides a detection signal to the processor. It should be noted that any number of Hall effect sensors may be fixed to the mounting element 862 as part of the sensing assembly 880. Moreover, accuracy of the absolute display angle may be improved with more Hall effect sensors included in the sensing assembly 880.

The sensing assembly 880 is electrically coupled to a flexible cable 830 or a PCB that includes a connector 832 (e.g., board-to-board connector, coaxial connector, etc.) The flexible cable 830 may provide electrical signals from the sensor 860 to a processor/main logic board (not illustrated).

Thereafter, the processor may determine an absolute display angle between the lid portion 120-A and the base portion 120-B based on which of the Hall effect sensors 860-A, B, C, D, E, F, G is triggered.

FIGS. 8B-8D illustrate various cross-sectional views of the sensor system 800, in accordance with some embodiments. As illustrated in FIG. 8B, the Hall effect sensor 860-A is triggered, and provides a corresponding detection (binary) signal to the processor. In response, the processor determines that the absolute display angle between the lid portion 120-A and the base portion 120-B is 0°. As illustrated in FIG. 8C, the Hall effect sensor 860-C is triggered, and provides a corresponding detection (binary) signal to the processor. In response, the processor determines that the absolute display angle between the lid portion 120-A and the base portion 120-B is 90°. As illustrated in FIG. 8D, the Hall effect sensor 860-D is triggered, and provides a corresponding detection (binary) signal to the processor. In response, the processor determines that the absolute display angle between the lid portion 120-A and the base portion 120-B is 135°.

Figure 9:
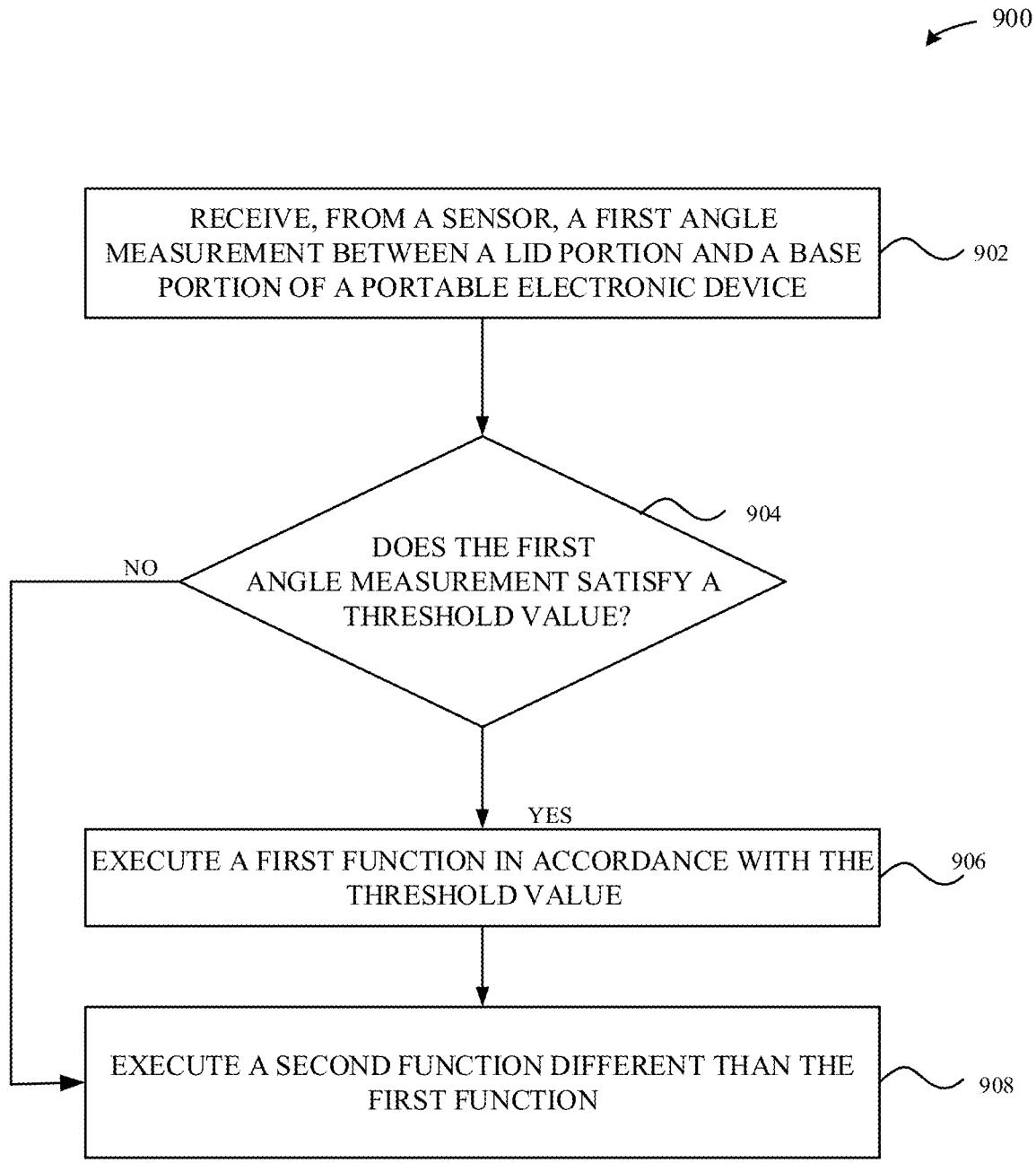
FIG. 9 illustrates a flowchart for determining a display angle by a sensor system, in accordance with some embodiments.

FIG. 9 illustrates a flow diagram of a method 900 for executing different instructions based on the display angle, in accordance with some embodiments. As illustrated in FIG. 9, at step 902, the processor receives, from a sensor 360, an angle measurement between a lid portion 120-A and a base portion 120-B of the portable electronic device 100.

At step 904, the processor determines whether the angle measurement satisfies a threshold value. In response to determining that the angle measurement satisfies the threshold value, then the processor executes a first function at step 906. Alternatively, if the angle measurement does not satisfy the threshold value, then the processor executes a second function at step 908.

Figure 10:
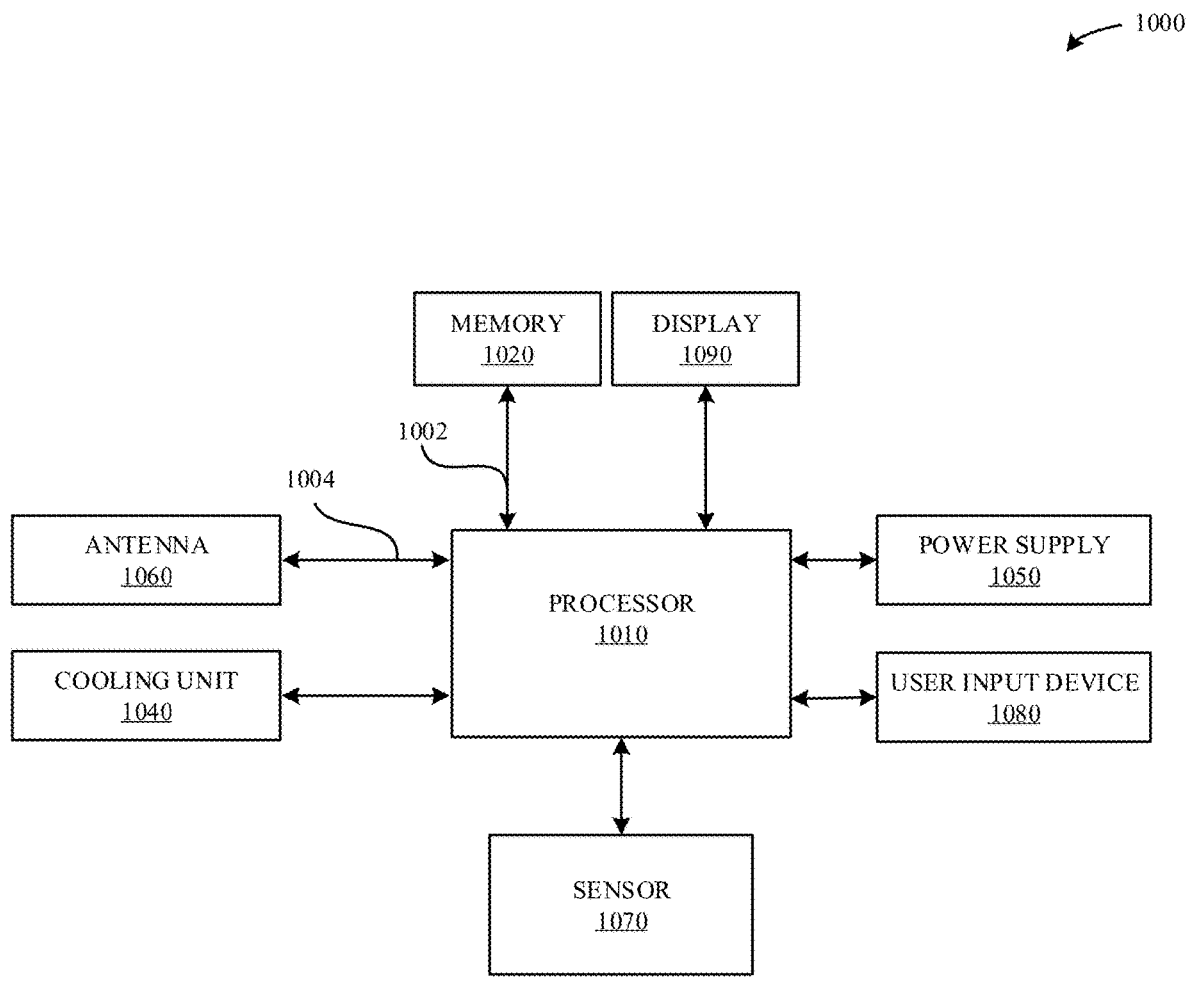
FIG. 10 illustrates a system diagram of a portable electronic device, in accordance with some embodiments.

FIG. 10 illustrates a system diagram of a portable electronic device 1000 that is capable of implementing the various techniques described herein, according to some embodiments. In particular, the detailed view illustrates various components that can be included in the portable electronic device 100 as illustrated in FIG. 1.

As shown in FIG. 10, the portable electronic device 1000 includes a processor 1010 for controlling the overall operation of the portable electronic device 1000. The portable electronic device 1000 can include a display 1090. The display 1090 can be a touch screen panel that can include a sensor (e.g., capacitance sensor). The display 1090 can be controlled by the processor 1010 to display information to the user. A data bus 1002 can facilitate data transfer between at least one memory 1020 and the processor 1010. A network interface 1004 can facilitate data transfer between an antenna 1060 and the processor 1010.

The portable electronic device 1000 includes a user input device 1080, such as a switch. In some embodiments, the portable electronic device 1000 includes a sensor 1070, such as a magnetic sensor as described herein. The portable electronic device 1000 includes a power supply unit 1050, such as a lithium-ion battery.

The portable electronic device 1000 may include a cooling unit 1040, such as a fan and/or a controller. In some embodiments, the controller is in electronic communication with the processor 1010 and is capable of receiving instructions from the processor 1010 for controlling the speed (e.g., RPM) of the fan in order to manage thermal performance and acoustic performance.

The portable electronic device 1000 also includes a memory 1020, which can comprise a single disk or multiple disks (e.g., hard drives), and includes a storage management module that manages one or more partitions within the memory 1020. In some embodiments, the memory 1020 can include flash memory, semiconductor (solid state) memory or the like. The portable electronic device 1000 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 1000.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%.

As described above, one aspect of the present technology is the gathering and use of data available from various sources to improve the delivery to users of personal content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. A portable electronic device, comprising:
    a housing including (i) a first case, and (ii) a second case pivotally coupled to the first case at a hinge assembly and along a pivot axis, wherein the housing is capable of carrying components that include:
        a processor capable of providing instructions;
        an operational component in communication with the processor, wherein the operational component is capable of executing a function; and
        an angular detection system positioned within the hinge assembly and in communication with the processor, wherein the angular detection system includes:
            a magnetic element capable of generating a magnetic field, wherein the magnetic field is characterized as having a magnetic field orientation, and
            a magnetic sensor concentrically aligned with the magnetic element at the pivot axis and capable of determining an angle between the first case and the second case based on the magnetic field orientation.

2. The portable electronic device of claim 1, wherein when the processor determines that the angle between the first case and the second case satisfies a predetermined threshold angle, the processor provides the instructions to the operational component such as to cause the operational component to execute the function.

3. The portable electronic device of claim 1, wherein the components further include:
    a flex cable that provides the instructions from the processor to the operational component.

4. The portable electronic device of claim 3, wherein when the processor determines that the angle between the first case and the second case does not satisfy the predetermined threshold angle, the processor prevents the operational component from executing the function.

5. The portable electronic device of claim 1, wherein the magnetic sensor includes a magnet power supply (NIPS) sensor, a Hall effect sensor or a tunnel-magnetoresistance (TMR) sensor.

6. The portable electronic device of claim 1, wherein the magnetic element is polarized through a diameter of the magnetic element.

7. The portable electronic device of claim 1, wherein the first and second cases are pivotably coupled together by a bushing.

8. A portable electronic device including an operational component and a first case that is pivotally coupled to a second case at a pivot axis, the portable electronic device comprising:

a processor capable of providing instructions;

a magnetic element carried by the first case, wherein the magnetic element is capable of generating a magnetic field having a magnetic field orientation; and a magnetic angle sensor carried by the second case and concentrically aligned with the magnetic element at the pivot axis, wherein while pivoting the first case relative to the second case, the magnetic angle sensor is capable of (i) determining an angle between the first case and the second case in accordance with the magnetic field orientation, and (ii) providing a corresponding detection signal to the processor when the angle satisfies a predetermined angle threshold such that the processor provides the instructions for executing a function by the operational component.

9. The portable electronic device of claim 8, wherein the processor does not provide the instructions for executing the function by the operational component when the angle does not satisfy the predetermined angle threshold.

10. The portable electronic device of claim 8, wherein the first and second cases are pivotally coupled together at the pivot axis by a bushing, and the bushing includes the magnetic angle sensor.

11. The portable electronic device of claim 8, wherein the magnetic element includes a circular shape such as to generate a generally uniform magnetic field.

12. The portable electronic device of claim 11, wherein a polarization direction of the magnetic field is through a diameter of the magnetic element.

13. The portable electronic device of claim 8, wherein the angle between the first case and the second case is between about 0 degrees to about 135 degrees.

14. A portable electronic device including a first part that is pivotally coupled at a pivot axis to a second part by a hinge assembly, the portable electronic device comprising:

a processor capable of providing instructions;

an operational component in communication with the processor, the operational component capable of executing a function based on the instructions provided by the processor; and an angular detection system included within the hinge assembly, the angular detection system including:

a magnetic element capable of providing a magnetic field; and an angle sensor concentrically aligned with the magnetic element at the pivot axis and in communication with the processor, such that (i) when the angle sensor determines that an angle between the first part and the second part satisfies a first angle threshold, the processor provides a first set of instructions such as to cause the operational component to execute a first function, and (ii) when the angle sensor determines that the angle between the first part and the second part satisfies a second angle threshold, the processor provides a second set of instructions such as to cause the operational component to execute a second function different than the first function.

15. The portable electronic device of claim 14, wherein the processor prevents the operational component from executing the second function when the angle between the first part and the second part satisfies the first angle threshold.

16. The portable electronic device of claim 14, wherein the magnetic element is polarized through a diameter of the magnetic element.

17. The portable electronic device of claim 14, wherein the magnetic element includes a circular shape such as to generate a generally uniform magnetic field.

18. The portable electronic device of claim 14, further comprising:

an input device capable of (i) receiving user input, and (ii) providing a corresponding output signal to the processor.

19. The portable electronic device of claim 14, wherein the hinge assembly includes a rotatable clutch shaft.

* * * * *

UNITED STATES PATENT AND TRADEMARK OFFICE
CERTIFICATE OF CORRECTION

| | |
|---|---|
| PATENT NO. | : 11,853,129 B1 |
| APPLICATION NO. | : 16/252193 |
| DATED | : December 26, 2023 |
| INVENTOR(S) | : Mehrdad Hooshmand et al. |

It is certified that error appears in the above-identified patent and that said Letters Patent is hereby corrected as shown below:

In the Claims

Column 16, Line 55 (Claim 5): "supply (NIPS)" should read: --supply (MPS)--.

Signed and Sealed this
Nineteenth Day of March, 2024

Katherine Kelly Vidal
Director of the United States Patent and Trademark Office